United States Patent
Lin et al.

(10) Patent No.: US 11,652,159 B2
(45) Date of Patent: May 16, 2023

(54) SEMICONDUCTOR DEVICES AND METHODS OF MANUFACTURING THEREOF

(71) Applicant: Taiwan Semiconductor Manufacturing Company Limited, Hsinchu (TW)

(72) Inventors: Shih-Yao Lin, New Taipei (TW); Chih-Han Lin, Hsinchu (TW); Hsiao Wen Lee, Hsinchu (TW)

(73) Assignee: TAIWAN SEMICONDUCTOR MANUFACTURING COMPANY LIMITED, Hsinchu (TW)

(*) Notice: Subject to any disclaimer, the term of this patent is extended or adjusted under 35 U.S.C. 154(b) by 171 days.

(21) Appl. No.: 17/081,875

(22) Filed: Oct. 27, 2020

(65) Prior Publication Data

US 2022/0130977 A1    Apr. 28, 2022

(51) Int. Cl.
*H01L 29/66* (2006.01)
*H01L 21/8234* (2006.01)
*H01L 27/092* (2006.01)

(52) U.S. Cl.
CPC .. *H01L 29/6681* (2013.01); *H01L 21/823431* (2013.01); *H01L 21/823468* (2013.01); *H01L 27/0924* (2013.01); *H01L 29/6656* (2013.01)

(58) Field of Classification Search
CPC ............ H01L 29/6681; H01L 29/6656; H01L 21/823431; H01L 21/823468; H01L 27/0924
See application file for complete search history.

(56) References Cited

U.S. PATENT DOCUMENTS

| | | | | |
|---|---|---|---|---|
| 2012/0068268 A1* | 3/2012 | Hsiao | .................. | H01L 29/6653 257/E27.06 |
| 2012/0139054 A1* | 6/2012 | Yin | .................... | H01L 29/66545 257/E21.409 |
| 2015/0034899 A1* | 2/2015 | Ching | ..................... | H01L 21/84 438/154 |
| 2015/0380406 A1* | 12/2015 | Chang | ............... | H01L 29/66545 257/369 |

* cited by examiner

*Primary Examiner* — Christine A Enad
(74) *Attorney, Agent, or Firm* — Foley & Lardner LLP

(57) ABSTRACT

A method of fabricating a semiconductor device is disclosed. The method includes providing a fin layer. Dummy gates are formed over the fin layer, where the dummy gates are formed to taper from a smaller width at a top region of the dummy gates to a larger width at a bottom region of the dummy gates. Sidewall spacers are formed on sidewalls of the dummy gates. An interlayer dielectric is formed in regions between the dummy gates and contacts the sidewall spacers. The dummy gates are removed to form openings in the interlayer dielectric and to expose the sidewall spacers on sides of the openings in the interlayer dielectric. The sidewall spacers are etched at a greater rate at a top region of the sidewall spacers than at a bottom region of the sidewall spacers.

20 Claims, 19 Drawing Sheets

SEMICONDUCTOR DEVICES AND METHODS OF MANUFACTURING THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-12 illustrate cross-sectional views cut with the channel (X-X in perspective view of FIG. 16).

FIG. 15A illustrates the sidewall spacer to have a first sub-layer, and a second sub-layer, while FIG. 15B illustrates the sidewall spacer to have a first sub-layer, a second sub-layer, and a third sub-layer.

DETAILED DESCRIPTION

Figure 1:
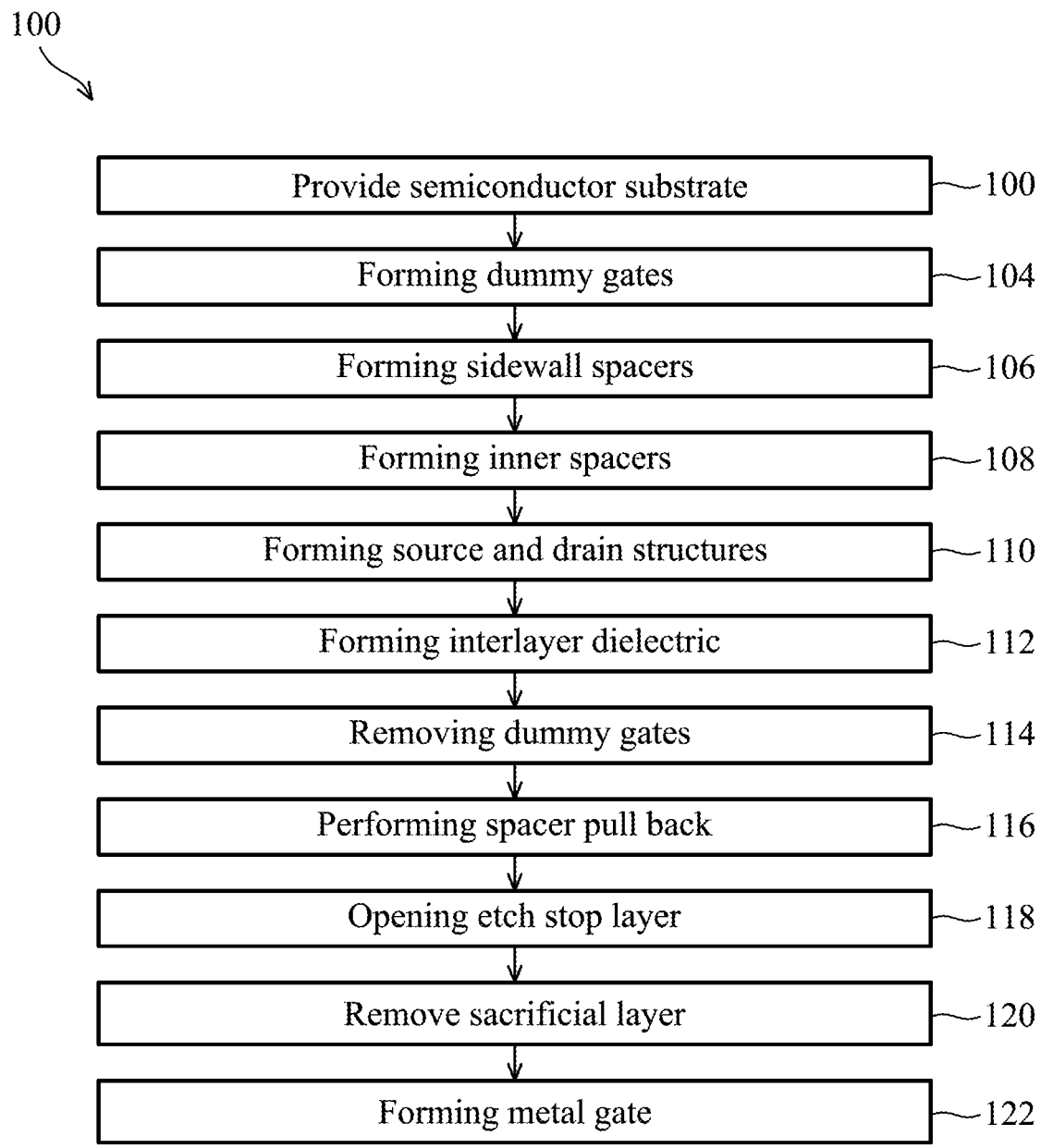
FIG. 1 illustrates a flow chart of an example method to make a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current ($I_{on}$), smaller subthreshold leakage current ($I_{off}$), etc. Such a transistor that has a gate structure fully wrapping around its channel is typically referred to as a gate-all-around (GAA) transistor or GAAFET.

The present disclosure provides various embodiments of a semiconductor device, which may include a FinFET or GAA transistor.

Embodiments of the present disclosure are discussed in the context of forming a non-planar transistor, such as a FinFET or GAA transistor, and in particular, in the context of forming a transistor having a conduction channel out of a plane in which a substrate is disposed. In some embodiments, a fin layer is provided. Subsequently dummy gates are over the fin layer. The dummy gates are formed to taper from a smaller width at a top region of the dummy gates to a larger width at a bottom region of the dummy gates. Next sidewall spacers are formed on sidewalls of the dummy gates. An interlayer dielectric (first dielectric) is formed in regions between the dummy gates and contacting the sidewall spacers. Subsequently, the dummy gates are removed to form openings in the interlayer dielectric and to expose the sidewall spacers on sides of the openings in the interlayer dielectric. The sidewall spacers are etched at a greater rate at a top region of the sidewall spacers than at a bottom region of the sidewall spacers.

A fin-based transistor formed by the above described method can advantageously control the dummy gate profile to provide an improved dummy gate process control reducing risk of dummy gate line collapse and improvement of line width roughness (LWR) and line edge roughness (LER). With decreasing size of fin-based transistors, device elements formed during production, such as dummy lines, are correspondingly reduced in size. Smaller dummy gates, however, can cause line collapse, or line twist defects, thereby decreasing device yield and performance. Various embodiments of the present disclosure address the line collapse and line twist defect issues by controlling the dummy gate profile so the dummy gate is tapered to have a smaller width at a top region of the dummy gate. The tapered dummy gate with a smaller top region may provide a trade-off for high-k dielectric metal gate (HKMG) fill process window. According to various embodiments, the HKMG fill process window is increased by a sidewall spacer pull-back process. Thus, the yield of a fin-based transistor, made by the currently disclosed method is improved.

FIG. 1 illustrates a flowchart of a method 100 to form a non-planar transistor device, according to one or more embodiments of the present disclosure. For example, at least some of the operations (or steps) of the method 100 can be used to form a GAAFET (or a FinFET) transistor device such as, for example, a nanosheet transistor device, a nanowire transistor device, a vertical transistor device, or the like. Further, the method 100 can be used to form a GAA transistor (or FinFET transistor) device in a respective conduction type such as, for example, an n-type GAA transistor device or a p-type GAA transistor device. The term "n-type," as used herein, may be referred to as the conduction type of a transistor having electrons as its conduction carriers; and the term "p-type," as used herein, may be referred to as the conduction type of a transistor having holes as its conduction carriers.

It is noted that the method 100 is merely an example, and is not intended to limit the present disclosure. Accordingly, it is understood that additional operations may be provided before, during, and after the method 100 of FIG. 1, and that some other operations may only be briefly described herein. In various embodiments, operations of the method 100 may be associated with perspective views of an example GAAFET transistor device at various fabrication stages as shown in the various Figures.

In brief overview, the method 100 starts with operation 102 of providing a substrate overlaid by a number of first semiconductor layers and a number of second semiconductor layers. Next, the method 100 proceeds to operation 104 of forming dummy gates over the first and second semiconductor layers. Next, the method 100 proceeds to operation 106 of forming sidewall spacers. Next, the method 100 proceeds to operation 108 of forming inner spacers. Next, the method 100 proceeds to operation 110 of forming source and drain regions. Next, the method 100 proceeds to operation 112 of forming an interlevel dielectric (ILD) (first dielectric). Next, the method 100 proceeds to operation 114 of removing the dummy gates. Next, the method 100 proceeds to operation 116 of performing spacer pull-back. Next, the method 100 proceeds to operation 118 of opening the etch stop layer. Next, the method 100 proceeds to operation 120 of removing the sacrificial layer through the opened etch stop. Next, the method 100 proceeds to operation 122 of forming the metal gate.

Figure 2:
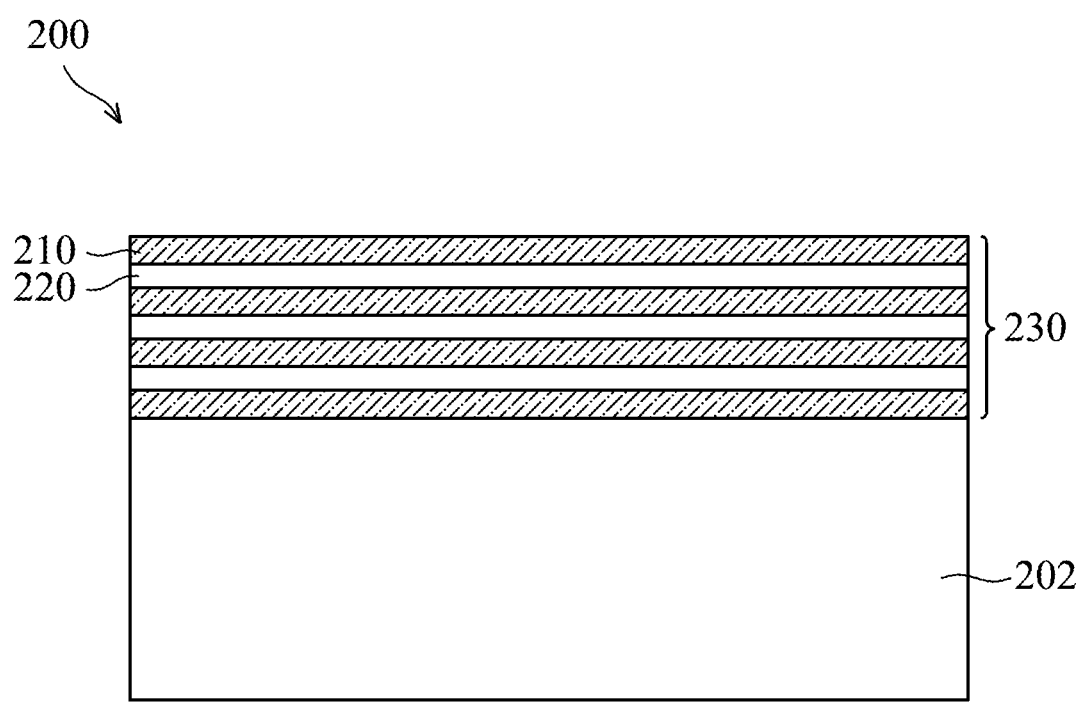
FIGS. 2-12, illustrate cross-sectional views of a semiconductor device, made by the method of FIG. 1, during various fabrication stages in accordance with some embodiments.

Corresponding to operation 102 of FIG. 1, FIG. 2 is a cross-sectional view of the GAA transistor device 200 including a number of first semiconductor layers 210 and a number of second semiconductor layers 220 formed on a semiconductor substrate 202 at one of the various stages of fabrication, where the first semiconductor layers 210 function as sacrificial layers, as discussed later. As shown in the illustrated example of FIG. 2, the semiconductor layers 210 and 220 are formed as a stack over the semiconductor substrate 202. The semiconductor layers 210 and 220 together comprise a fin layer 230. In some embodiments the transistor device may be other than a GAA transistor device, and the fin layer 230 may be formed of a single semiconductor material.

The semiconductor substrate 202 includes a semiconductor material substrate, for example, silicon. Alternatively, the semiconductor substrate 202 may include other elementary semiconductor material such as, for example, germanium. The semiconductor substrate 202 may also include a compound semiconductor such as silicon carbide, gallium arsenide, indium arsenide, and indium phosphide. The semiconductor substrate 202 may include an alloy semiconductor such as silicon germanium, silicon germanium carbide, gallium arsenic phosphide, and gallium indium phosphide. In one embodiment, the semiconductor substrate 202 includes an epitaxial layer. For example, the semiconductor substrate 202 may have an epitaxial layer overlying a bulk semiconductor. Furthermore, the semiconductor substrate 202 may include a semiconductor-on-insulator (SOI) structure. For example, the semiconductor substrate 202 may include a buried oxide (BOX) layer formed by a process such as separation by implanted oxygen (SIMOX) or other suitable technique, such as wafer bonding and grinding.

The first semiconductor layers 210 and the second semiconductor layers 220 are alternatingly disposed on top of one another (e.g., along the Z direction) to form a stack. For example, one of the second semiconductor layers 220 is disposed over one of the first semiconductor layers 210 then another one of the first semiconductor layers 220 is disposed over the second semiconductor layer 210, so on and so forth.

The stack may include any number of alternately disposed semiconductor layers 210 and 220. The semiconductor layers 210 and 220 may have different thicknesses. The first semiconductor layers 210 may have different thicknesses from one layer to another layer. The second semiconductor layers 220 may have different thicknesses from one layer to another layer. The thickness of each of the semiconductor layers 210 and 220 may range from a few nanometers to a few tens of nanometers. The first layer of the stack may be thicker than other semiconductor layers 210 and 220. In an embodiment, each of the first semiconductor layers 210 has a thickness ranging from about 5 nanometers (nm) to about 20 nm, and each of the second semiconductor layers 220 has a thickness ranging from about 5 nm to about 20 nm.

The two semiconductor layers 210 and 220 have different compositions. In various embodiments, the two semiconductor layers 210 and 220 have compositions that provide for different oxidation rates and/or different etch selectivity between the layers. In an embodiment, the semiconductor layers 210 include silicon germanium ($Si_{1-x}Ge_x$), and the semiconductor layers include silicon (Si). In an embodiment, each of the semiconductor layers 220 is silicon that may be undoped or substantially dopant-free (i.e., having an extrinsic dopant concentration from about 0 $cm^{-3}$ to about $1 \times 10^{17}$ $cm^{-3}$), where for example, no intentional doping is performed when forming the layers 220 (e.g., of silicon).

In various embodiments, the semiconductor layers 220 may be intentionally doped. For example, when the GAA transistor device 200 is configured in n-type (and operates in an enhancement mode), each of the semiconductor layers 220 may be silicon that is doped with a p-type dopant such as boron (B), aluminum (Al), indium (In), and gallium (Ga); and when the GAA transistor device 200 is configured in p-type (and operates in an enhancement mode), each of the semiconductor layers 220 may be silicon that is doped with an n-type dopant such as phosphorus (P), arsenic (As), antimony (Sb). In another example, when the GAA transistor device 200 is configured in n-type (and operates in a depletion mode), each of the semiconductor layers 220 may be silicon that is doped with an n-type dopant instead; and when the GAA transistor device 200 is configured in p-type (and operates in a depletion mode), each of the semiconductor layers 220 may be silicon that is doped with a p-type dopant instead. In some embodiments, each of the semiconductor layers 210 is $Si_{1-x}Ge_x$ that includes less than 50% (x<0.5) Ge in molar ratio. For example, Ge may comprise about 15% to 35% of the semiconductor layers of $Si_{1-x}Ge_x$ in molar ratio. Furthermore, the first semiconductor layers 210 may include different compositions among them, and the second semiconductor layers 220 may include different compositions among them.

Either of the semiconductor layers 210 and 220 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 210 and 220 may be chosen based on providing differing oxidation rates and/or etch selectivity.

The semiconductor layers 210 and 220 can be epitaxially grown from the semiconductor substrate 202. For example, each of the semiconductor layers 210 and 220 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 202 extends upwardly, resulting in the semiconductor layers 210 and 220 having the same crystal orientation with the semiconductor substrate 202.

Figure 3:
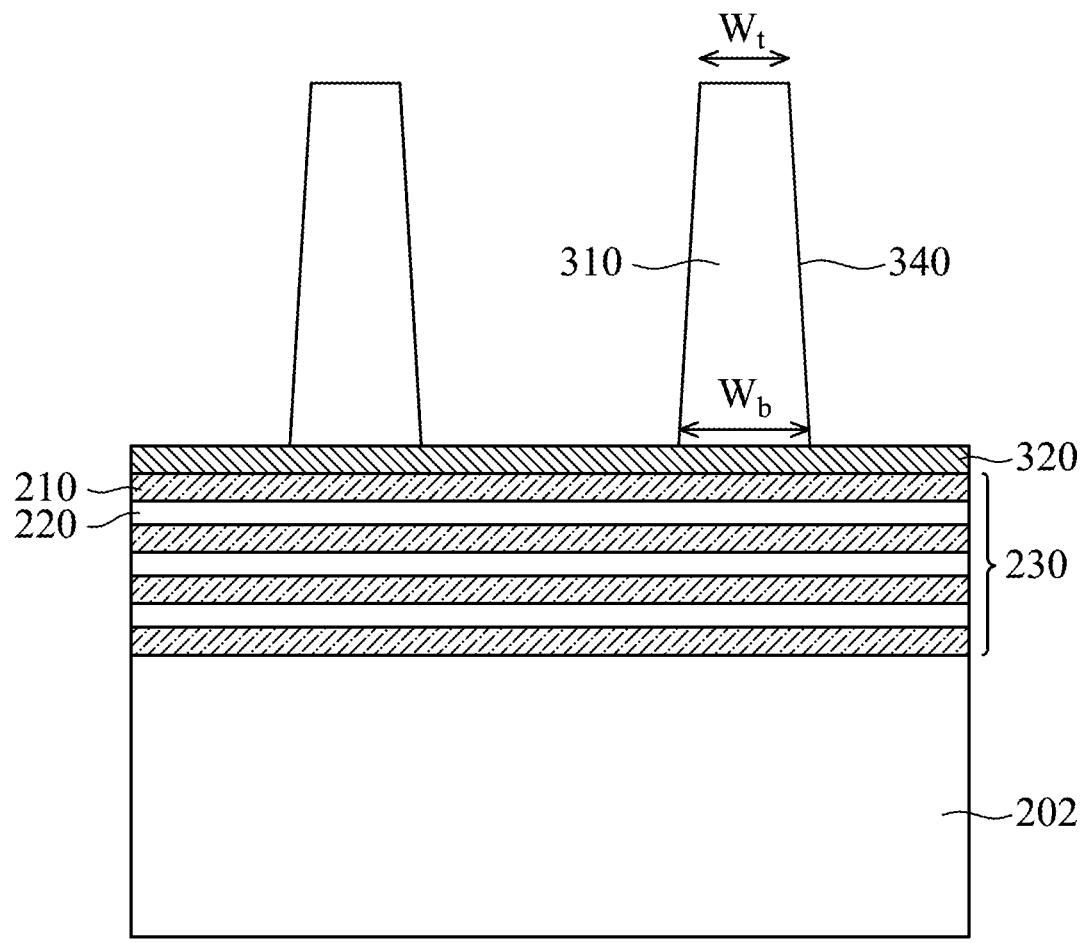

Corresponding to operation 104 of FIG. 1, FIG. 3 is a cross-sectional view of the GAA transistor device 200 with formed tapered dummy gates 310. An etch stop layer 320 may be formed over the semiconductor layers 210 and 220, and tapered dummy gates 310 formed on the etch stop layer 320. The etch stop layer 320 may include silicon oxide. The etch stop layer 320 may be formed by a deposition process, such as CVD (such as PECVD, HARP, or combinations thereof) process, ALD process, another applicable process, or a combination thereof.

The dummy gates 310 are formed to have a smaller width Wt at a top region of the dummy gates 310 than a width Wb at a bottom region at a bottom region of the dummy gates 310. As dummy gate material is formed over the semiconductor layers 210 and 220, and then photolithographically processed to form the tapered dummy gates. For example, the tapered dummy gates 310 may be formed by patterning using an etch mask, where the etch mask is patterned photoresist or a hard mask. The dummy gate material may be formed of a semiconductor material, such as Si, for example, or a dielectric material, for example.

In general, for dry etching, it is desirable to dry etch a dummy gate material under a bias power that has a lower lateral etch at the bottom region of the dummy gate 310 than at the top region of the dummy gate 310. The etching conditions for forming the tapered dummy gates 310 will depend on the material of the dummy gate material. For example, for a dummy gate material of silicon, a main etch gas of a dry etch may include at least one of $Cl_2$, HBr, $CF_4$, $CHF_3$, $CH_2F_2$, $CH_3F$, $C_4F_6$, $BCl_3$, $SF_6$, or $H_2$. A passivation gas for tuning etch selectivity of the dry etch may include at least one of $N_2$, $O_2$, $CO_2$, $SO_2$, CO or $SiCl_4$. The carrier gas may be at least one of Ar, He, or Ne, for example. A plasma source power may be about 10 W to about 3000 W, for example. A plasma bias power may be about 0 W to about 3000 W, for example. A pressure may be about 1 mTorr to about 800 mTorr, and the etch gas flow rate may be about 1 sccm to about 5000 sccm, for example.

The bias power controls the etch direction, namely to control the degree of anisotropy of the dry etch. The degree of anisotropy is adjusted to provide a lower lateral etch at the bottom region of the dummy gates 310 than at the top region of the dummy gate 310. The taper of the dummy gates 310 reduce the line collapse, and provide an improvement in the line width roughness (LWR) and line edge roughness (LER).

Figure 4:
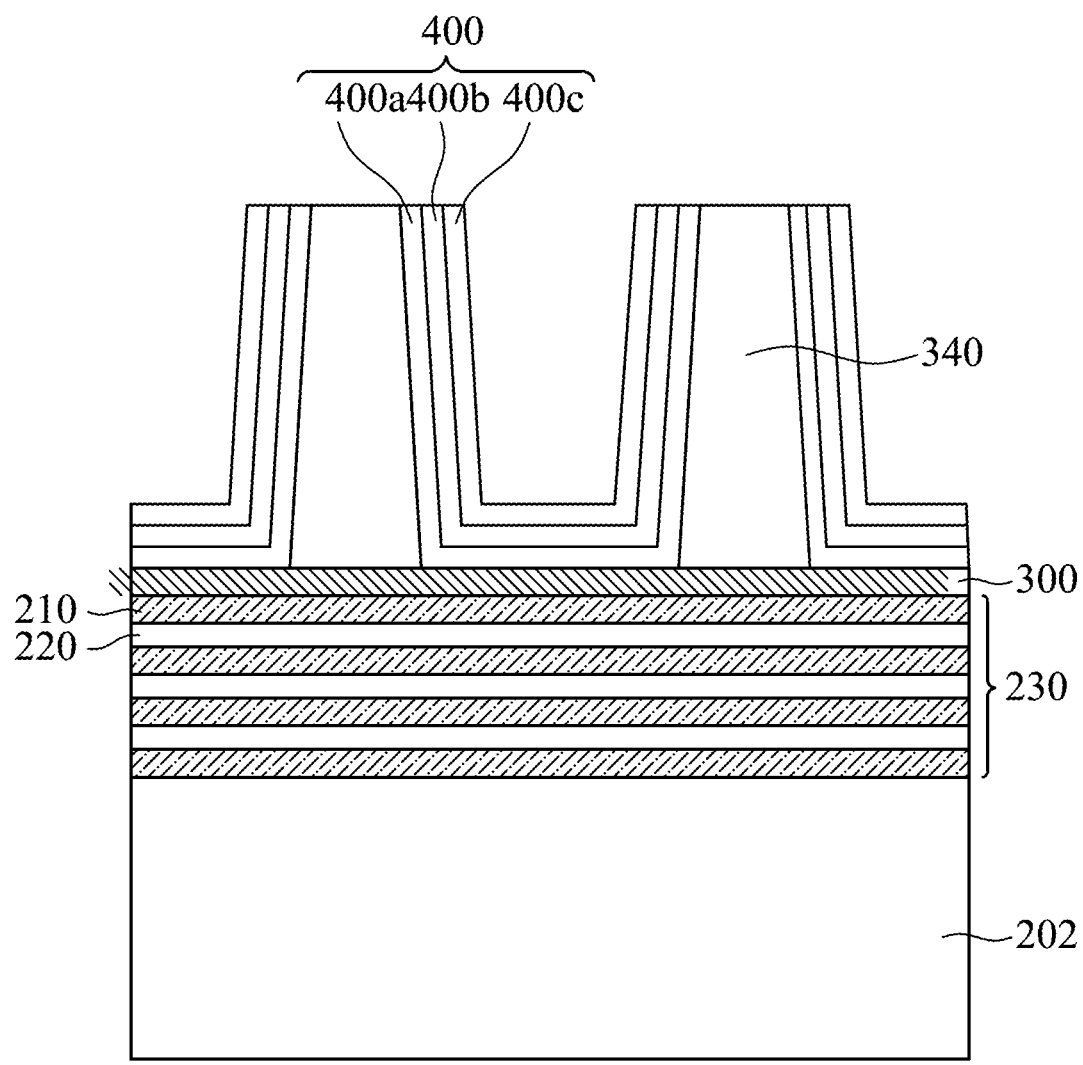

The etching of the dummy gate material may include a wet clean etch, for example. The wet clean etch may include, for example for a Si dummy gate material, a main etch chemical of at least one of HF, $F_2$, or $H_3PO_4$, an assisted etch chemical for selectivity tuning of at least one of O3, $H_2SO_4$, HCl, HBr, or $NH_3$, and a solvent of at least one of DI water, alcohol or acetone, Corresponding to operation 106 of FIG. 1, FIG. 4 is a cross-sectional view of the GAA transistor device 200 with sidewall spacers 400. The sidewall spacers 400 are formed on sidewalls 340 of the dummy gates 310. Any suitable deposition method, such as thermal oxidation, chemical vapor deposition (CVD), physical vapor deposition (PVD), atomic layer deposition (ALD), or the like, may be used to form the sidewall spacers 400. The shapes and formation methods of the sidewall spacers 400 as illustrated and described in FIG. 4 are merely non-limiting examples, and other shapes and formation methods are possible. These and other variations are fully intended to be included within the scope of the present disclosure.

The sidewall spacer 400 may include a number of sublayers. The number of sublayers may between 1 and 9, for example. FIG. 4 illustrates an example with three sublayers, namely a first sub-layer 400a on the sidewalls 340 of the dummy gates 310, a second sub-layer 400b on the first sub-layer 400a, and a third sub-layer 400c on the second sub-layer 400b. The sub-layers may be formed of different materials, for example.

FIG. 4 illustrates the device with a sidewall spacer 400 having sublayers. In subsequent Figures, the specific sublayers may not be shown for ease of illustration, and only the sidewall spacer 400 may be shown.

The sidewall spacer 400, and its sublayers, may be Si-based materials, for example, such as at least one of SiN, SiON, SiCN, SiOCN, SiO2, or SiC. Alternatively, the sidewall spacer 400, and its sublayers, may be metal-based materials, for example, such as at least one of HfO or Al2O3. The thickness of the sublayers may be between 0.5 nm and 100 nm, for example.

Figure 5:
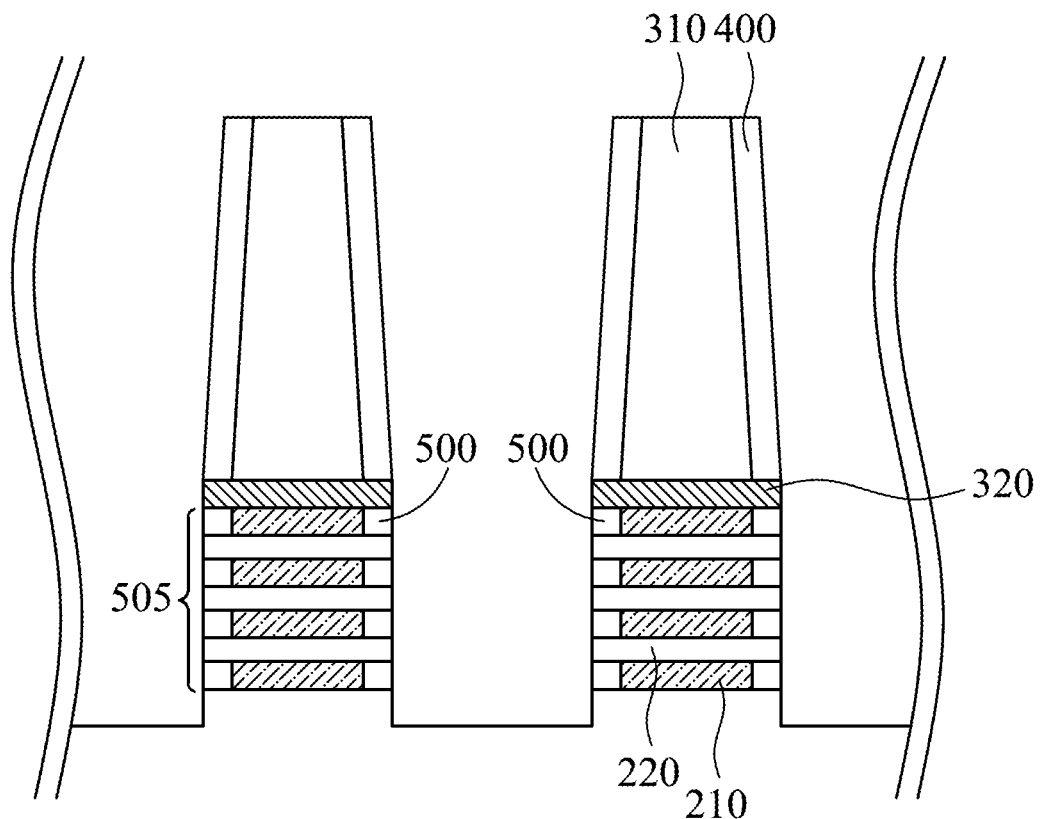

Corresponding to operation 108 of FIG. 1, FIG. 5 is a cross-sectional view of the GAA transistor device 200 with inner spacers 500. The portion of the sidewall spacer 400 and the portion of the etch stop layer 320 that is in the opening between adjacent dummy gates 310 is removed to expose an upper portion of the stack of the first semiconductor layers 210 and the second semiconductor layers 220. For example, an appropriate anisotropic etch may remove the portion of the sidewall spacer 400 and the portion of the etch stop layer 320 that is in the opening between adjacent dummy gates 310 using an appropriate dry etch with the dummy gates 310 as an etch mask. The etching of the sidewall spacer 400 and the etch stop layer 320 may be performed with a first etch for the sidewall spacer 400 and a second etch for the etch stop layer 320.

Once an upper portion of the stack of the first semiconductor layers 210 and the second semiconductor layers 220 are exposed in regions between the dummy gates 310, the stack of the first semiconductor layers 210 and the second semiconductor layers 220 is patterned by an etch to form fins 505. For example, the reactive ion etch may be (RIE), neutral beam etch (NBE), the like, or combinations thereof. The etch may be anisotropic.

Once the first semiconductor layers 210 and the second semiconductor layers 220 are patterned, the inner spacers 500 are formed laterally adjacent to the first semiconductor layers 210, which layers 210 are sacrificial layers as discussed later. End portions of the semiconductor layers 210 can be removed (e.g., etched) using a "pull-back" process to pull the semiconductor layers 210. It is understood that the pull-back distance (i.e., the extent to which each of the semiconductor layers 210 is etched, or pulled-back) can be arbitrarily increased or decreased. In an example where the semiconductor layers 220 include Si, and the semiconductor layers 210 include $Si_{1-x}Ge_x$, the pull-back process may include a hydrogen chloride (HCl) gas isotropic etch process, which etches SiGe without attacking Si. As such, the semiconductor layers 220 may remain substantially intact during this process.

The inner spacers 500 can be formed by conformal deposition by chemical vapor deposition (CVD), or by monolayer doping (MLD) of nitride followed by spacer RIE. The inner spacers 500 can be deposited using, e.g., a conformal deposition process and subsequent isotropic or anisotropic etch back to remove excess spacer material on the sidewalls of the fins 505 and on a surface of the semiconductor substrate 202. A material of the inner spacers 500 can be, for example, formed of silicon nitride, silicon boron carbonitride, silicon carbonitride, silicon carbon oxynitride, or any other type of dielectric material (e.g., a dielectric material having a dielectric constant less than about 5) appropriate to the role of forming an insulating gate sidewall spacers of transistors.

Figure 6:
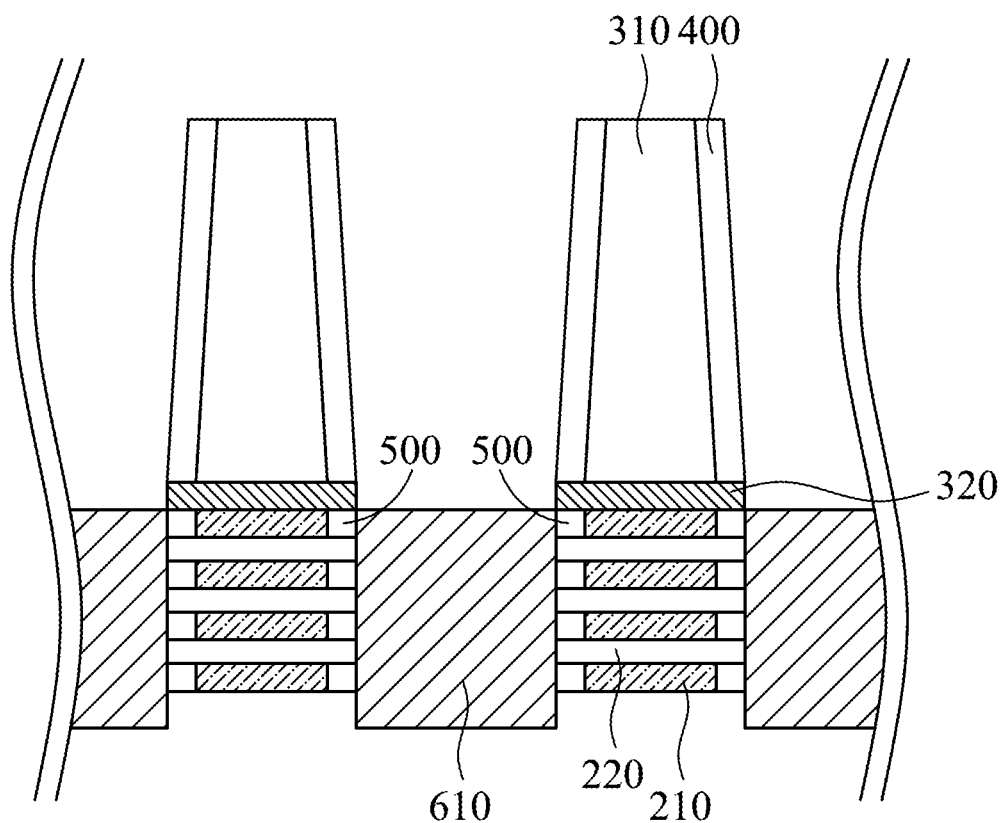

Corresponding to operation 110 of FIG. 1, FIG. 6 is a cross-sectional view of the GAA transistor device 200 with source/drains 610 formed between the fins 505. As shown in the illustrated example of FIG. 6, the source/drains 610 are formed in the regions between the fins 505, which regions are formed when the fins 505 were formed. The source/drain structures 610 are coupled to respective ends of the fins 505 of each of the semiconductor layers 220.

The source/drain structures 610 may each include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), or combinations thereof. The source/drain structures 610 may be formed using an epitaxial layer growth process on exposed ends of each of the semiconductor layers 220. For example, the growth process can include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epitaxial processes.

In-situ doping (ISD) may be applied to form doped source/drain structures 610, thereby creating the junctions for the GAA transistor device 200. For example, when the GAA transistor device 200 is configured in n-type, the source/drain structures 610 can be doped by implanting n-type dopants, e.g., arsenic (As), phosphorous (P), etc., into them. When the GAA transistor device 200 is configured in p-type, the source/drain structures 610 can be doped by implanting p-type dopants, e.g., boron (B), etc., into them.

Figure 7:
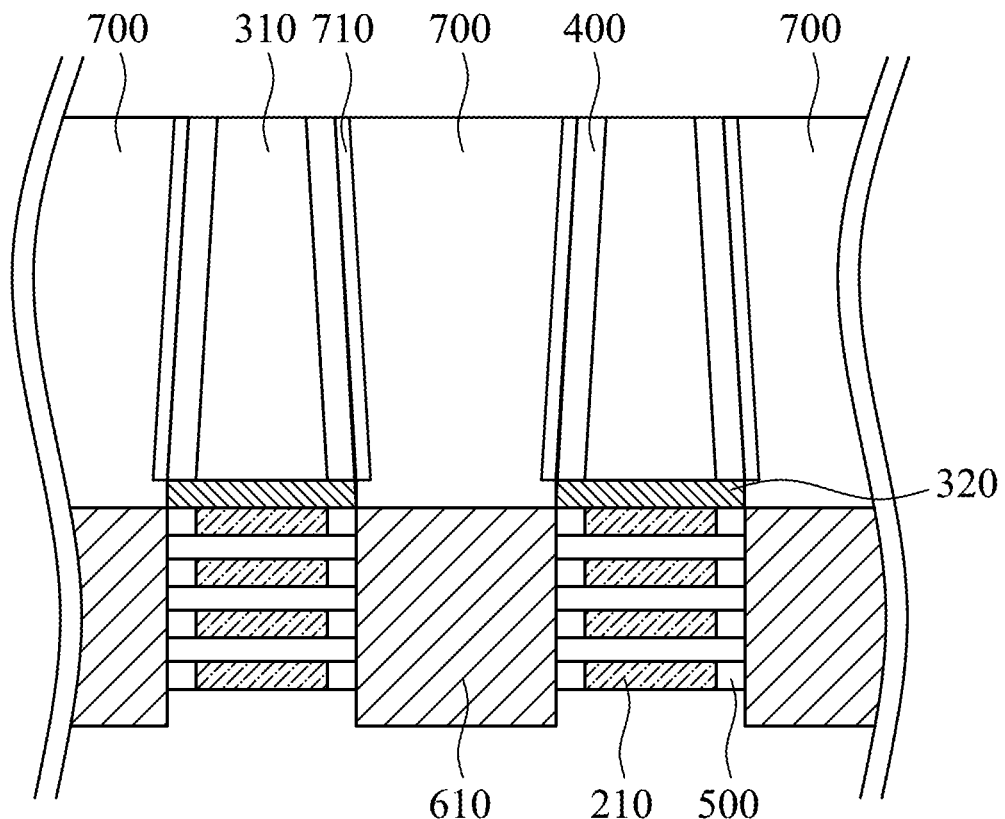

Corresponding to operation 112 of FIG. 1, FIG. 7 is a cross-sectional view of the GAA transistor device 200 including an inter-layer dielectric (ILD) 700 at one of the various stages of fabrication. As shown in the illustrated example of FIG. 7, the ILD 700 is formed on opposing sides of each of the dummy gates 310 to overlay the source/drain structures 610 and the dummy fin structures 600, with a contact etch stop layer 710 disposed therebetween.

The contact etch stop layer 710 may be first formed over the source/drain structures 610, and the dummy gates 310. The contact etch stop layer 710 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 700 is formed over the contact etch stop layer 710. In some embodiments, the ILD 700 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. Next, a planarization process, such as a CMP process, may be performed to achieve a level top surface for the ILD 700. After the planarization process, the top surface of the ILD 700 is level with a top surface of the dummy gates 310, in some embodiments.

Figure 8:
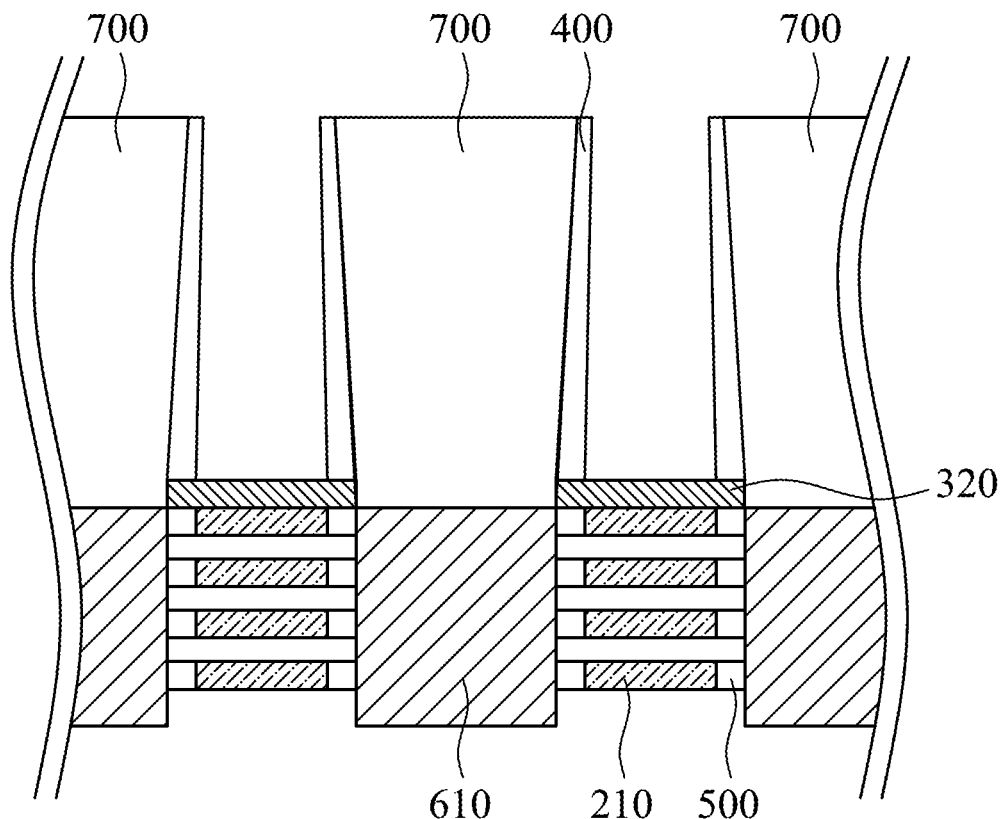

Corresponding to operation 114 of FIG. 1, FIG. 8 is a cross-sectional view of the GAA transistor device 200 including removing the dummy gates 310. Subsequently to forming the ILD 700, the dummy gates 310, are removed. The dummy gates 310 can be removed by an etching process, e.g., RIE or chemical oxide removal (COR).

Figure 9:
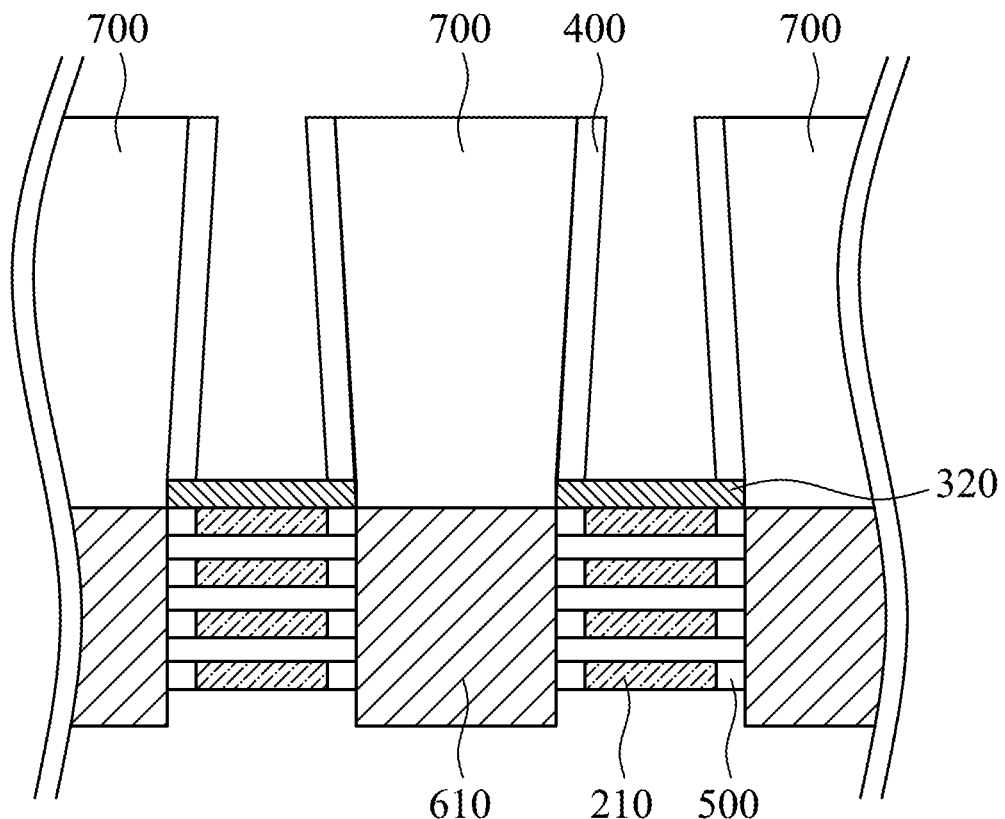

Corresponding to operation 116 of FIG. 1, FIG. 9 is a cross-sectional view of the GAA transistor device 200 including sidewall spacer pull back of the sidewall spacers 400 which now contact sidewalls of the ILD 700. In a similar fashion to the etching to form the tapered dummy gates, the sidewall spacers 400, along with one or more sub-layers, are etched while controlling the lateral etching. In general, for dry etch, it is desirable to dry etch the sidewall spacers 400 under a bias power that has a lower lateral etch at the bottom region of the ILD 700 than at the top region of the ILD 700. The etching conditions for sidewall spacer pull back will depend on the material of the sidewall spacers 400. As an example, a main etch gas of a dry etch may include at least one of $Cl_2$, HBr, $CF_4$, $CHF_3$, $CH_2F_2$, $CH_3F$, $C_4F_6$, $BCl_3$, $SF_6$, or $H_2$. A passivation gas for tuning etch selectivity of the dry etch may includes at least one of $N_2$, $O_2$, $CO_2$, $SO_2$, CO or $SiCl_4$. The carrier gas may be at least one of Ar, He, or Ne, for example. A plasma source power may be about 10 W to about 3000 W, for example. A plasma bias power may be about 0 W to about 3000 W, for example. A pressure may about 1 mTorr to about 800 mTorr, and the etch gas flow rate may be about 1 sccm to about 5000 sccm, for example.

The bias power controls the etch direction, namely to control the degree of anisotropy of the dry etch. The degree of anisotropy is adjusted to provide a lower lateral etch at the bottom region of ILD 700 than at the top region of the ILD 700.

The etching of the sidewall spacers 400 may include a wet clean etch, for example. The wet clean etch may include, for example, a main etch chemical of at least one of HF, $F_2$, or $H_3PO_4$, an assisted etch chemical for selectivity tuning of at least one of O3, $H_2SO_4$, HCl, HBr, or $NH_3$, and a solvent of at least one of DI water, alcohol or acetone.

The pull-back etch of the sidewall spacers 400 result in the thickness of a portion of the sidewall spacers 400 being greater at a bottom region of the ILD 700 than at a top region of the ILD 700. For example, the ratio of a thickness of the sidewall spacers 400 at bottom region of the ILD 700 to that at a top region of the ILD 700 may be 2:1 or greater.

The remaining etch stop layer 320 beneficially protects the underlying inner spacers 510 during the sidewall spacer pull back process. In this case a high etch selectivity (relative etch rate) of the sidewall spacer 400 and etch stop layer may be desired over that of the inner spacers 510. Further, while the sidewall spacer pull back process mainly provides a pull-back (e.g., lateral) etch, some of the etch stop layer 320 is also etched. Thus, for the etching conditions for the sidewall spacer pull-back etch, some of the etch stop layer 320 is also etched. Thus, etch selectivity with a higher etch rate for the sidewall spacer 400 is desired. As one example, the etch selectivity to reduce damage of an $SiO_2$ etch stop layer 320 may be provided by the introduction of $O_2$ gas.

Further, a higher etch rate at the top of the sidewall spacer 400 than at the bottom of the sidewall spacer 400 may be achieved by providing a low bias power. Alternatively, a higher etch rate at the top of the sidewall spacer 400 than at the bottom of the sidewall spacer 400 may be achieved by a higher pressure.

Figure 10:
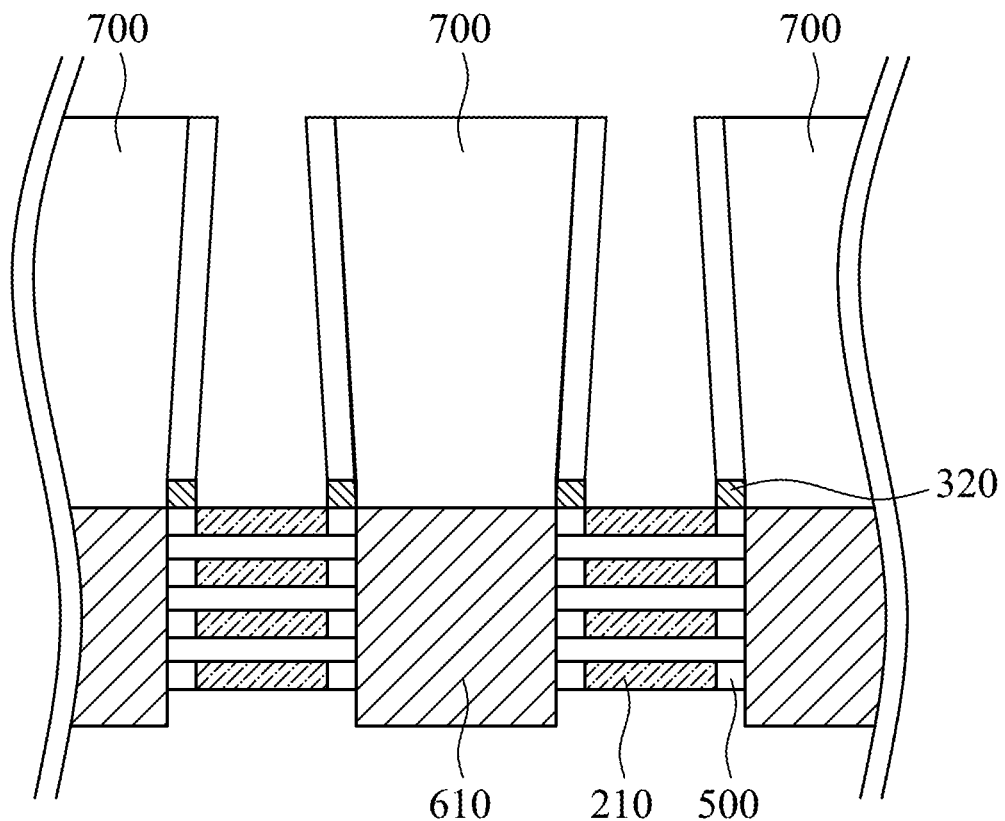

Corresponding to operation 118 of FIG. 1, FIG. 10 is a cross-sectional view of the GAA transistor device 200 including opening the remaining etch stop layer 320. The remaining etch stop layer 320 may be opened to expose the underlying first semiconductor layers 210. The etch stop layer 320 may be opened using an appropriate etch for the material of the etch stop layer 320, such as by an anisotropic dry etch or an isotropic wet etch, for example. While the remaining etch stop layer 320 may be opened to expose the underlying first semiconductor layers 210, the remaining etch stop layer 320 need not be removed.

Figure 11:
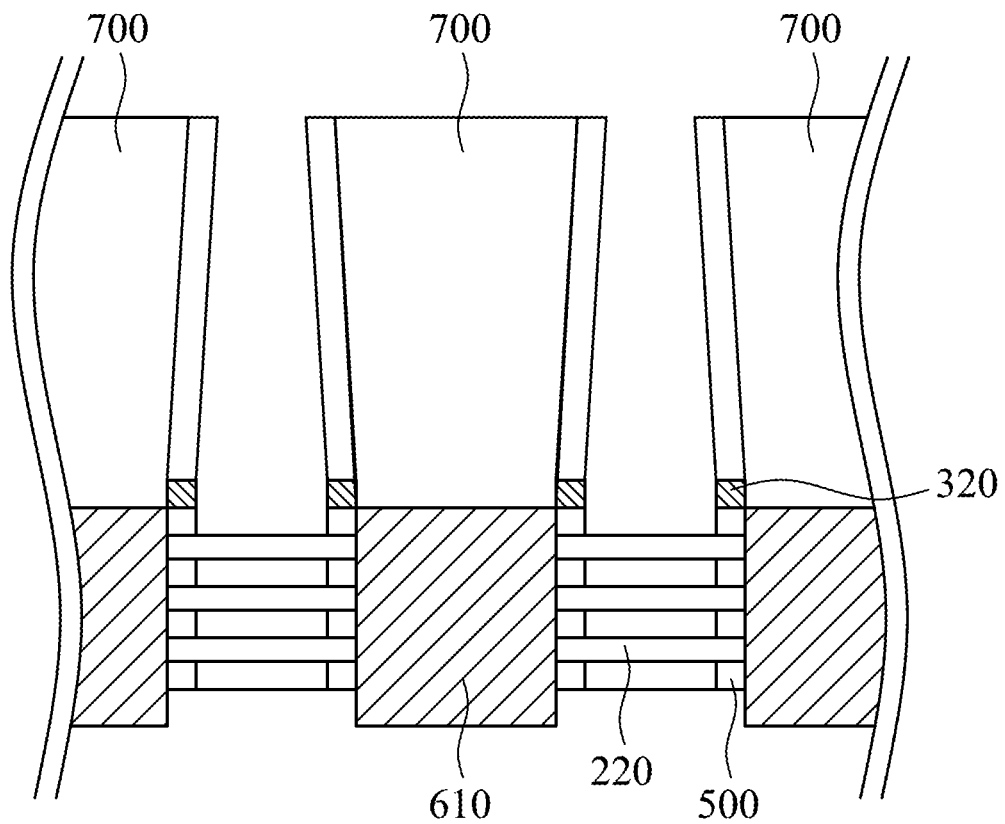

Corresponding to operation 120 of FIG. 1, FIG. 11 is a cross-sectional view of the GAA transistor device 200 including removing the first semiconductors 210 through the opened etch stop layer. Once the etch stop layer 320 has been opened, the underlying first semiconductor layers 210 may be removed through the opening. The semiconductor layers 210 are removed by applying a selective etch (e.g., a hydrochloric acid (HCl)), while leaving the semiconductor layers 220 substantially intact. After the removal of the semiconductor layers 210, a respective bottom surface and top surface of each of the semiconductor layers 220 may be exposed.

Figure 12:
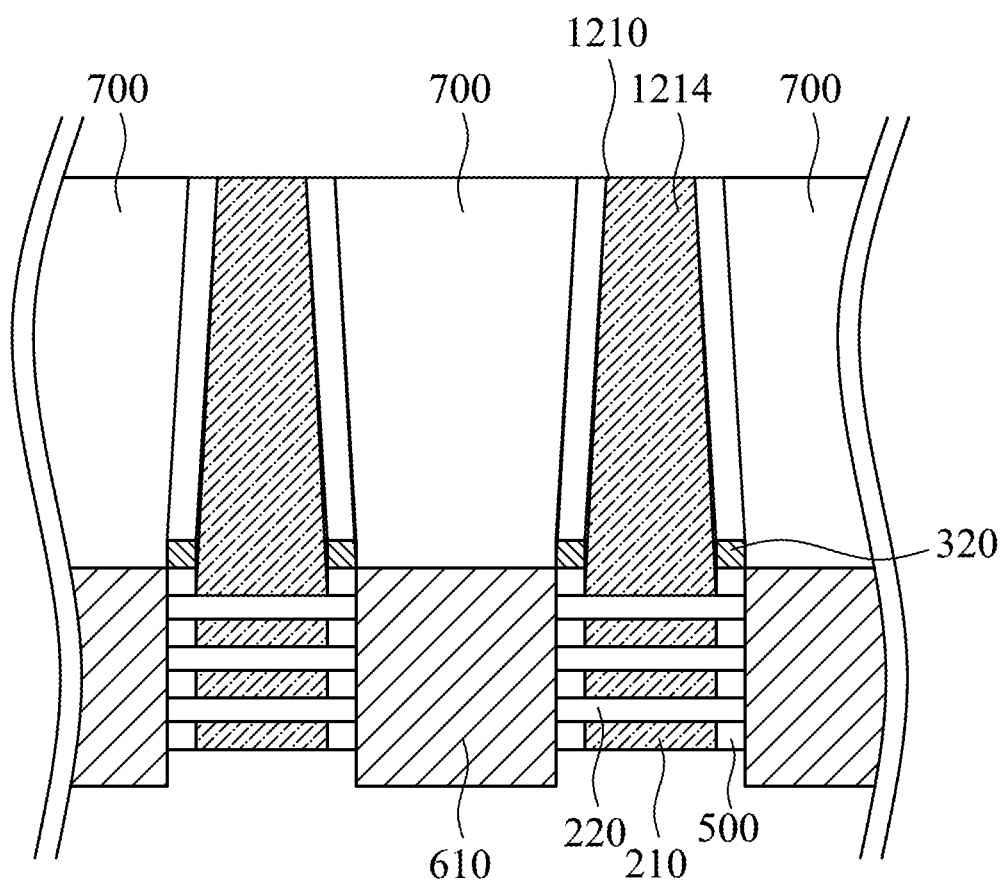

Corresponding to operation 122 of FIG. 1, FIG. 12 is a cross-sectional view of the GAA transistor device 200 including forming active gates. The active gates 1210 may be formed in the opening in the ILD 700 and wrap around the semiconductor layers 220. The active gates 1210 may include a gate dielectric (not shown for simplicity) and a gate metal 1214. The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer.

The gate metal 1214 can wrap around each of the semiconductor layers 220 with the gate dielectric disposed therebetween. The gate metal 1214 may include a stack of multiple metal materials. For example, the gate metal 1214 may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

FIG. 12 illustrates three levels of second semiconductor 220 for each fin 505, where each level of the second semiconductor 220 for a fin 505 corresponds to a different channel. FIG. 12 further illustrates the number of levels of the inner spacer 500 for a fin is also three. In general, the number of levels of the second semiconductor 220 (channels) and levels of inner spacer 500 may be more or less than three for each fin 505. For example, the number of levels of the second semiconductor 220 (channels) and the number of levels of inner spacer 500 may be between 1 and 10 for each fin 505. Further, the number of levels of inner spacer 500 may be the same as, or one more than, number of levels of the second semiconductor 220 for each fin 505.

Figure 13A:
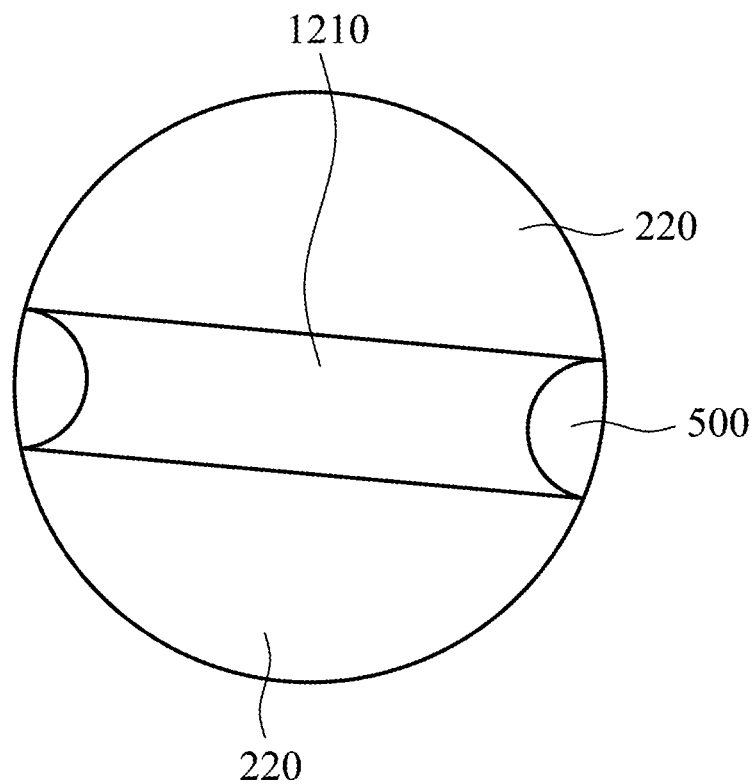
FIGS. 13A and 13B illustrate magnified cross-sectional views of a portion of the device of FIG. 12 in a region showing portions of the conductive gate, second semiconductor material (channel), and inner spacer in accordance with some embodiments.
Figure 13B:
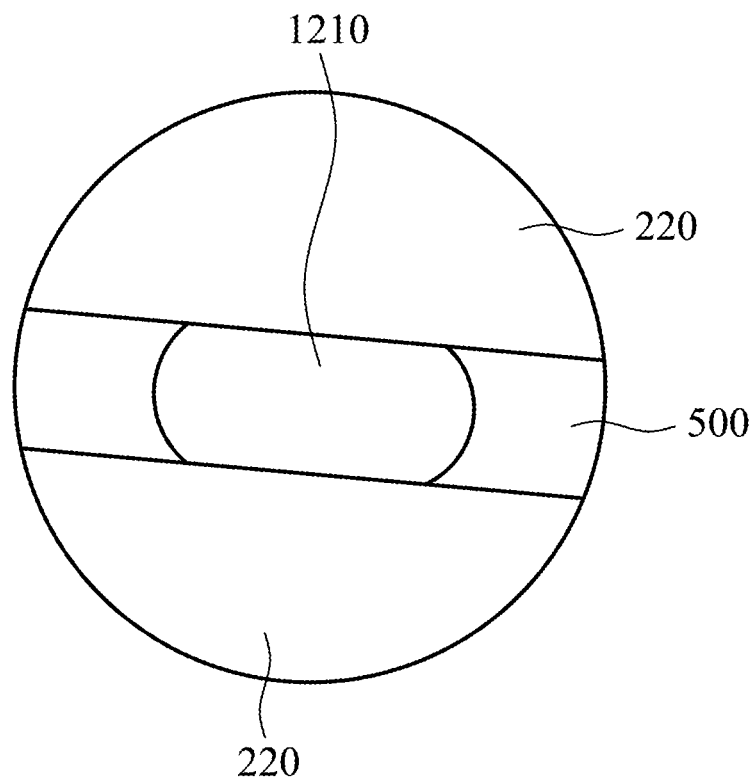

FIGS. 13A and 13B illustrate magnified cross sectional views of a portion of the device 200 of FIG. 12 in a region showing portions of the active gate 1210, second semiconductor material 220 (channel), and inner spacer 500. As can be seen, the shape of the inner spacer 500 may be concave as shown in FIG. 13A. Alternatively, the shape of the inner spacer 500 may be convex as shown in FIG. 13B.

Figure 14A:
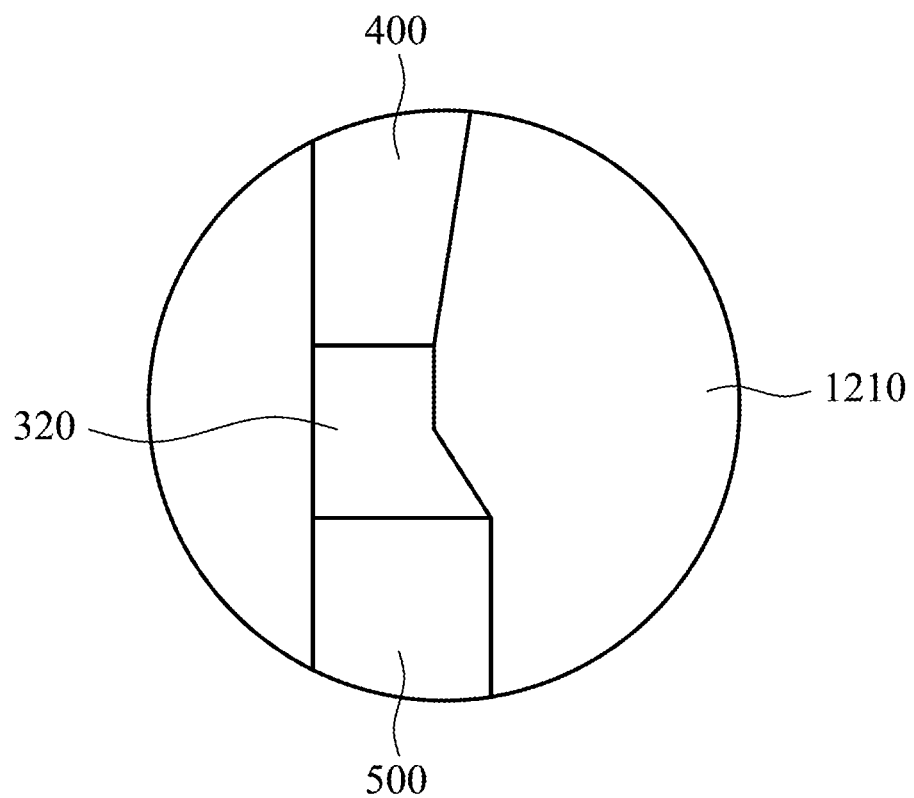
FIGS. 14A and 14B illustrate magnified cross-sectional views of a portion of the device of FIG. 12 in a region showing portions of the ILD, active gate, sidewall layer, etch stop layer, and inner spacer in accordance with some embodiments.
Figure 14B:
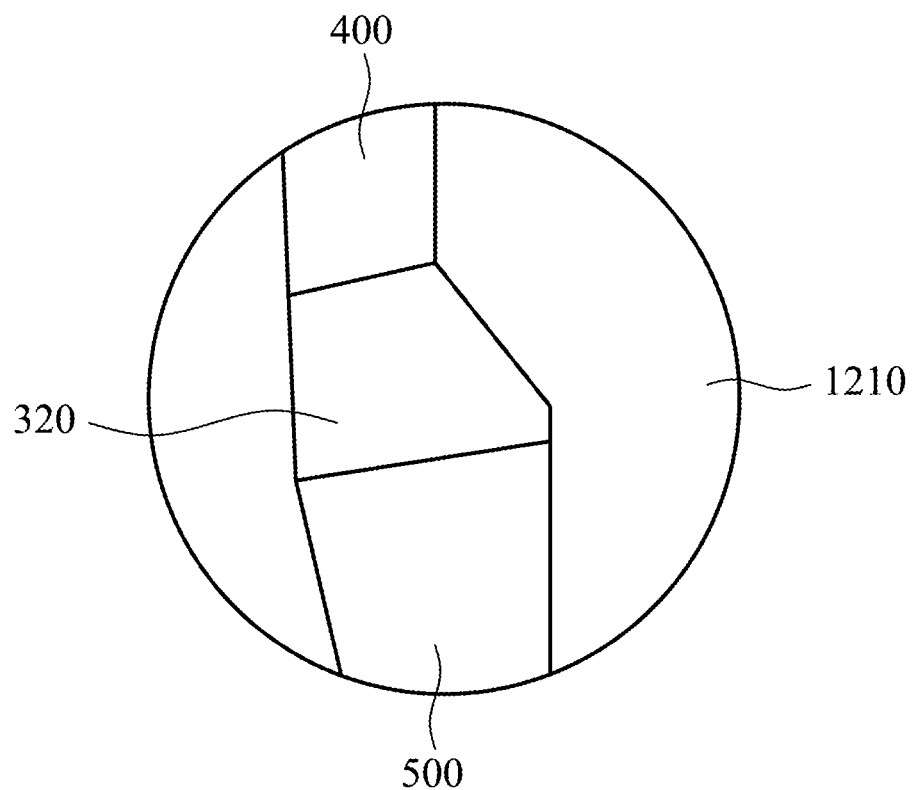

FIGS. 14A and 14B illustrate magnified cross-sectional views of a portion of the device 200 of FIG. 12 in a region showing portions of the ILD 700, active gate 1210, sidewall layer 400, etch stop layer 320, and inner spacer 500. The profile of the etch stop layer 320 from the sidewall layer 400 to the inner spacer 500 may be curved (smile curve) as shown in FIG. 14A, or a line as shown in FIG. 14B.

Further, while FIGS. 14A and 14B illustrate the lateral thickness of the sidewall spacer 400 at a bottom region of the ILD 700 to be less than that of the inner spacer 500, in general the lateral thickness of the sidewall spacer 400 may be the same as, or greater than, that of the inner spacer 500 at a bottom region of the ILD 700.

Figure 15A:
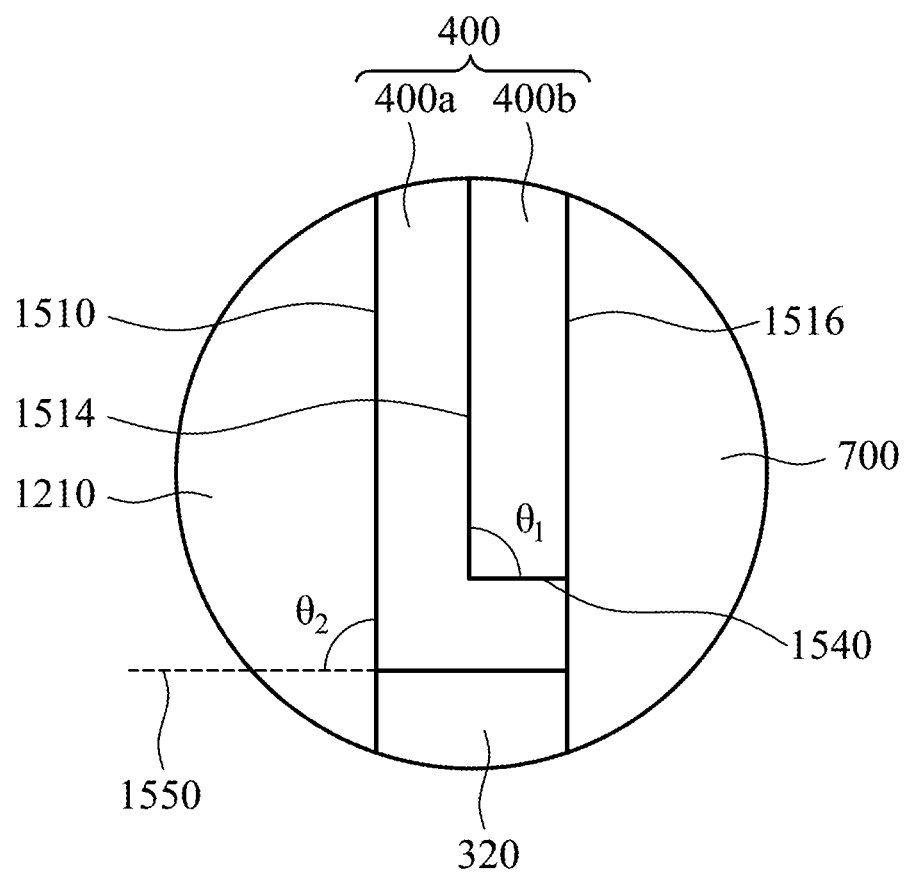
FIGS. 15A and 15B illustrate magnified cross-sectional views of a portion of the device of FIG. 12 in a region showing portions of the ILD, active gate, sidewall spacer, and etch stop layer in accordance with some embodiments.
Figure 15B:
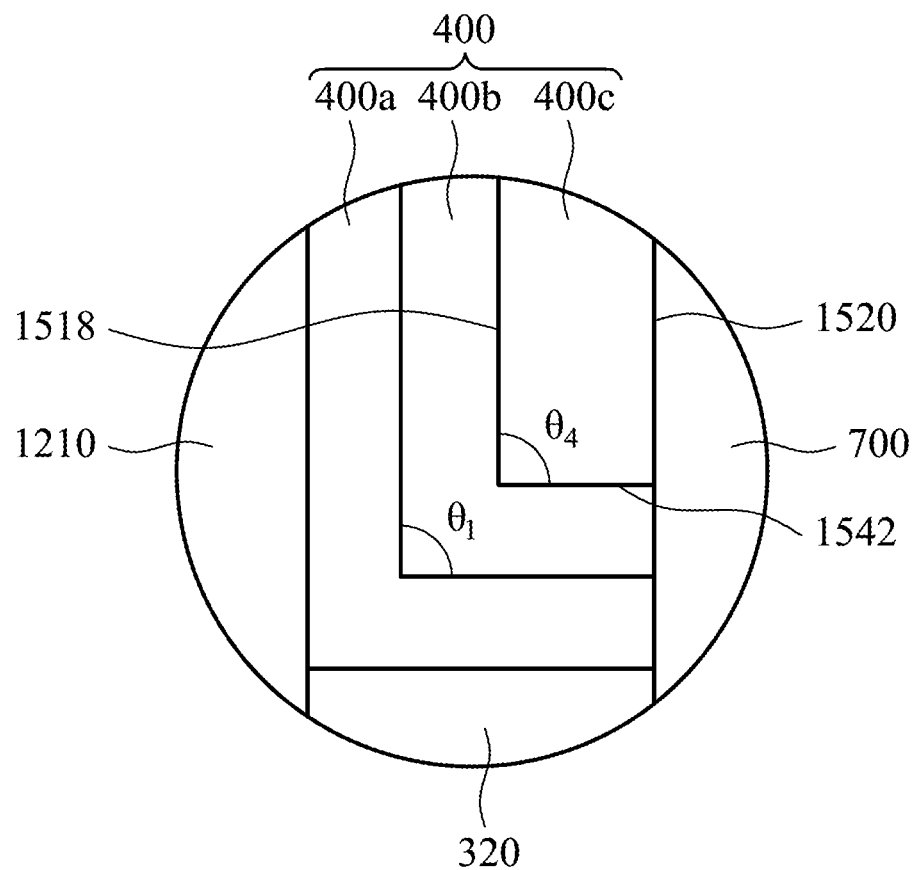

FIGS. 15A and 15B illustrates magnified cross sectional views of a portion of the device 200 of FIG. 12 in a region showing portions of the ILD 700, active gate 1210, sidewall spacer 400, and etch stop layer 320. FIG. 15A illustrates the sidewall spacer 400 to have a first sub-layer 400a, and a second sub-layer 400b, while FIG. 15B illustrates the sidewall spacer 400 to have a first sub-layer 400a, a second sub-layer 400b, and a third sub-layer 400c. The sidewall spacer 400 is disposed on a sidewall of the active gate 1210 and extends from a bottom region of the ILD 700 to a top region of the ILD 700, as shown in FIG. 12. The first sub-layer 400a has a first surface 1510 contacting the active gate 1210 and a second surface 1512 opposite the first surface 1510. The second sub-layer 400b has a third surface 1514 contacting the second surface 1512, and a fourth surface 1516 opposite the third surface 1514. An angle $\theta_1$ between a bottom surface 1540 of the second sub-layer 400b and the third surface 1514 is greater than 90 degrees.

Referring to FIG. 15B, The third sub-layer 400c has a fifth surface 1518 contacting the fourth surface 1516, and a sixth surface 1520 opposite the fifth surface 1518. An angle $\theta_4$ between a bottom surface 1542 of the third sub-layer 400c and the fifth surface 1518 is greater than 90 degrees. The bottom surfaces 1540 and 1542 may be parallel to each other. In general for the nth sublayer, where n is greater than 1, the angle between its bottom surface and its surface opposing the active gate 1210 is greater than 90 degrees.

FIGS. 15A and 15B illustrate an angle $\theta_2$ between a line 1550 extending into the active gate 1210 along a bottom surface of the first sub-layer 400a, and the first surface 1510. According to some embodiments, the angle $\theta_2$ is greater than 90 degrees. Thus, the sum of the angles $\theta_1$ and $\theta_2$ is greater than 180 degrees.

Figure 16:
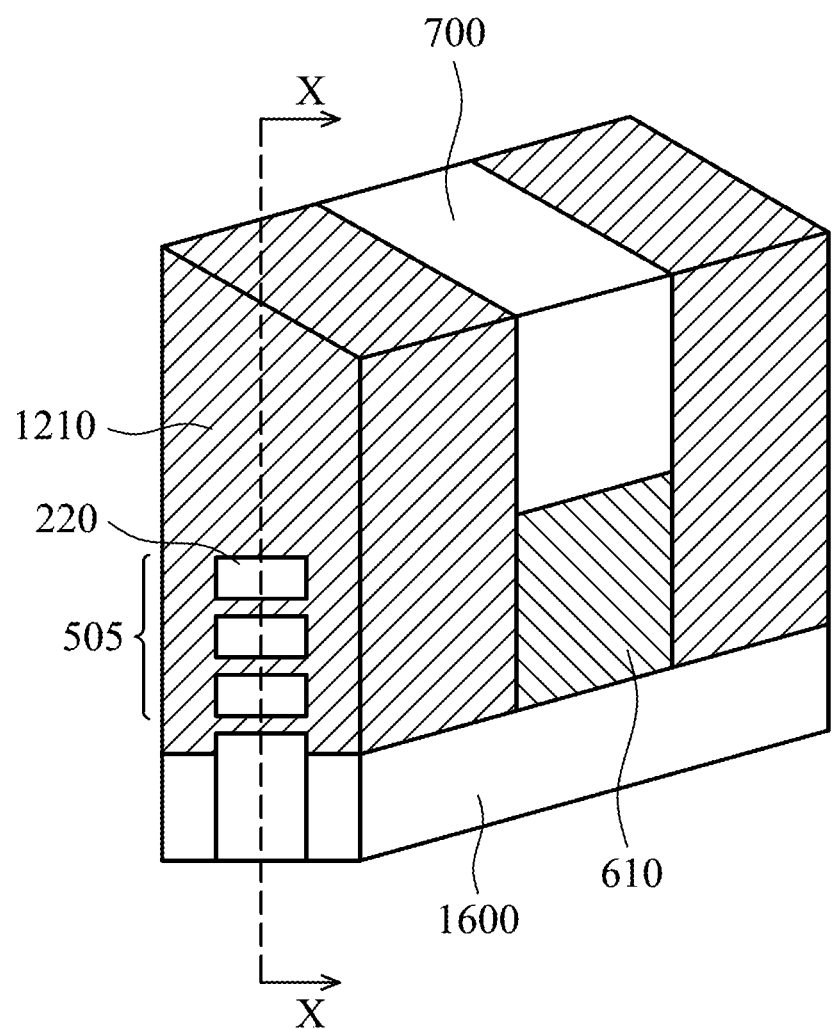
FIG. 16 illustrates a perspective view of the semiconductor device according to some embodiments.

Further, FIG. 16 illustrates a perspective view of the semiconductor device 200 according to some embodiments. The semiconductor device 200 includes fin 505 extending above the substrate and through dielectric isolation (STI) 1600. The active gates 1210 are formed between the second semiconductor layers 220 which act as channels between the S/D structures 610. The ILD 700 is disposed above the S/D structures 610 and adjacent the active gates 1210. The spacer 400 is disposed between the ILD 700 and the active gates 1210. FIGS. 2-12 illustrate cross-sectional views cut along the channel (X-X in FIG. 16).

In one aspect of the present disclosure, a method of fabricating a semiconductor device is disclosed. The method includes providing a fin layer. Dummy gates are formed over the fin layer, where the dummy gates are formed to taper from a smaller width at a top region of the dummy gates to a larger width at a bottom region of the dummy gates. Sidewall spacers are formed on sidewalls of the dummy gates. An interlayer dielectric is formed in regions between the dummy gates and contacts the sidewall spacers. The dummy gates are removed to form openings in the interlayer dielectric and to expose the sidewall spacers on sides of the openings in the interlayer dielectric. The sidewall spacers are etched at a greater rate at a top region of the sidewall spacers than at a bottom region of the sidewall spacers.

In another aspect of the present disclosure, a semiconductor device is disclosed. The semiconductor device includes a substrate. Fins are disposed above the substrate. A metal gate is disposed above the fins. An interlevel (first) dielectric is disposed laterally adjacent the metal gate, where the metal gate is disposed in openings in the first dielectric. Sidewall spacers are disposed on sidewalls of the metal gate between the metal gate and the first dielectric. The sidewall spacers extend from a bottom region of the first dielectric to a top region of the first dielectric. A thickness of the sidewall spacers at the top region of the first dielectric is less than a thickness of the sidewall spacers at the bottom region of the first dielectric.

In another aspect of the present disclosure, a semiconductor device is disclosed. The semiconductor device includes a substrate. Fins are disposed above the substrate. A metal gate is disposed above the fins. An interlevel (first) dielectric is disposed laterally adjacent the metal gate. The metal gate is disposed in openings in the first dielectric. Sidewall spacers are disposed on sidewalls of the metal gate between the metal gate and the first dielectric. The sidewall spacers extend from a bottom region of the first dielectric to a top region of the first dielectric. The sidewall spacers include at least a first sub-layer and a second sub-layer. The first sub-layer has a first surface contacting the metal gate and a second surface opposite the first surface. The second sub-layer has a third surface contacting the second surface and a fourth surface opposite the third surface. An angle between a bottom surface of the second sub-layer and the third surface is greater than 90 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   providing a fin layer;
   forming dummy gates over the fin layer, wherein the dummy gates are formed to taper from a smaller width at a top region of the dummy gates to a larger width at a bottom region of the dummy gates;
   forming sidewall spacers on sidewalls of the dummy gates;
   forming an interlayer dielectric in regions between the dummy gates and in contact with the sidewall spacers;
   removing the dummy gates to form openings in the interlayer dielectric and to expose the sidewall spacers on sides of the openings in the interlayer dielectric;
   etching the sidewall spacers at a greater rate at a top region of the sidewall spacers than at a bottom region of the sidewall spacers,
   wherein the etching of the sidewall spacers results in a thickness of the sidewall spacers at a top region of the interlevel dielectric being less than a thickness of the sidewall spacers at a bottom region of the interlevel dielectric.

2. The method of fabricating a semiconductor device according to claim 1, wherein the sidewall spacers include a plurality of sub-layers.

3. The method of fabricating a semiconductor device according to claim 2, wherein the sub-layers are formed of different materials.

4. The method of fabricating a semiconductor device according to claim 1, wherein the sidewall spacers include one to nine sub-layers.

5. The method of fabricating a semiconductor device according to claim 1, wherein the etching the sidewall spacers includes a dry etch.

6. The method of fabricating a semiconductor device according to claim 5, wherein the dry etching of the sidewall spacers is performed under a bias power that has a lower lateral etch at a bottom region of the of the interlayer dielectric than at a top region of the interlayer dielectric.

7. The method of fabricating a semiconductor device according to claim 5, wherein a main etch gas of the dry etch includes at least one of $Cl_2$, HBr, $CF_4$, $CHF_3$, $CH_2F_2$, $CH_3F$, $C_4F_6$, $BCl_3$, $SF_6$, or $H_2$.

8. The method of fabricating a semiconductor device according to claim 1, wherein the forming dummy gates comprises:

dry etching a dummy gate material under a bias power that has a lower lateral etch at the bottom region of the dummy gates than at the top region of the dummy gates.

9. The method of fabricating a semiconductor device according to claim 8, wherein a main etch gas of the dry etch includes at least one of $Cl_2$, HBr, $CF_4$, $CHF_3$, $CH_2F_2$, $CH_3F$, $C_4F_6$, $BCl_3$, $SF_6$, or $H_2$.

10. The method of fabricating a semiconductor device according to claim 8, wherein a passivation gas for tuning etch selectivity of the dry etch includes at least one of $N_2$, $O_2$, $CO_2$, $SO_2$, CO, or $SiCl_4$.

11. The method of fabricating a semiconductor device according to claim 1, further comprising forming fins from the fin layer.

12. The method of fabricating a semiconductor device according to claim 11, further comprising forming source/drain regions between the fins.

13. The method of fabricating a semiconductor device according to claim 11, further comprising forming an etch stop layer on the fins.

14. The method of fabricating a semiconductor device according to claim 13, further comprising etching etch the stop layer to expose the fins.

15. The method of fabricating a semiconductor device according to claim 14, wherein the fins include alternating first semiconductor layers and second semiconductor layers, the method further comprising etching and removing the first semiconductor layers.

16. The method of fabricating a semiconductor device according to claim 1, further comprising forming an active gate in the openings in the interlayer dielectric.

17. The method of fabricating a semiconductor device according to claim 16, wherein the active gate formation includes depositing a metal material.

18. The method of fabricating a semiconductor device according to claim 1, wherein the etching of the sidewall spacers include a wet clean etch.

19. The method of fabricating a semiconductor device according to claim 1, wherein the providing a fin layer includes depositing alternating layers of semiconductor material.

20. The method of fabricating a semiconductor device according to claim 19, wherein the alternating layers of semiconductor material are formed of different materials.

* * * * *